(12) United States Patent
Lee

(10) Patent No.: US 12,225,820 B2
(45) Date of Patent: Feb. 11, 2025

(54) THERMOELECTRIC GENERATION DEVICE

(71) Applicant: KELK Ltd., Kanagawa (JP)

(72) Inventor: Yonghoon Lee, Kanagawa (JP)

(73) Assignee: KELK Ltd., Kanagawa (JP)

( * ) Notice: Subject to any disclaimer, the term of this patent is extended or adjusted under 35 U.S.C. 154(b) by 16 days.

(21) Appl. No.: 17/797,816

(22) PCT Filed: Feb. 15, 2021

(86) PCT No.: PCT/JP2021/005457
§ 371 (c)(1),
(2) Date: Aug. 5, 2022

(87) PCT Pub. No.: WO2021/199728
PCT Pub. Date: Oct. 7, 2021

(65) Prior Publication Data
US 2023/0059573 A1    Feb. 23, 2023

(30) Foreign Application Priority Data

Mar. 31, 2020  (JP) .................................. 2020-062829

(51) Int. Cl.
*H10N 10/17*    (2023.01)
*H10N 10/82*    (2023.01)

(52) U.S. Cl.
CPC ............. *H10N 10/17* (2023.02); *H10N 10/82* (2023.02)

(58) Field of Classification Search
None
See application file for complete search history.

(56) References Cited

U.S. PATENT DOCUMENTS

| 7,026,712 | B2 | 4/2006 | Hayashi et al. | |
|---|---|---|---|---|
| 10,355,189 | B2 | 7/2019 | Lee et al. | |
| 2015/0013740 | A1* | 1/2015 | Kaibe | H10N 10/13 |
| | | | | 136/212 |
| 2017/0365761 | A1* | 12/2017 | Lee | H10N 10/80 |
| 2020/0203592 | A1* | 6/2020 | Kasichainula | H10N 10/17 |

FOREIGN PATENT DOCUMENTS

| CN | 108540044 A | * | 9/2018 |
|---|---|---|---|
| JP | 2000-349353 A | | 12/2000 |
| JP | 2016-164947 A | | 9/2016 |

OTHER PUBLICATIONS

Machine translation of CN108540044A (Year: 2018).*

* cited by examiner

*Primary Examiner* — Ryan S Cannon
(74) *Attorney, Agent, or Firm* — Fish & Richardson P.C.

(57) ABSTRACT

A thermoelectric generation device includes: a first substrate having a first surface; a second substrate having a second surface facing the first surface; a plurality of thermoelectric generation modules each of which has a plurality of thermoelectric elements and electrodes connecting the thermoelectric elements and which is arranged between the first surface and the second surface; and wiring that is arranged on the first surface and that connects the plurality of thermoelectric generation modules.

9 Claims, 5 Drawing Sheets

THERMOELECTRIC GENERATION DEVICE

CROSS-REFERENCE TO RELATED APPLICATIONS

This application is a National Stage application of International Application No. PCT/JP2021/005457, filed on Feb. 15, 2021, which claims priority to Japanese Patent Application No. 2020-062829, filed on Mar. 31, 2020. The contents of the prior applications are incorporated herein in their entirety.

FIELD

The present disclosure relates to a thermoelectric generation device.

BACKGROUND

A thermoelectric generation device including a thermoelectric generation module that generates power by using the Seebeck effect is known. The thermoelectric generation module has a cooling surface and a heating surface. The thermoelectric generation module generates power by a temperature difference between the cooling surface and the heating surface. Power generation efficiency of the thermoelectric generation module is improved as the temperature difference between the cooling surface and the heating surface becomes larger. A technology of connecting a plurality of thermoelectric generation modules in a bypass pattern is disclosed in Patent Literature 1.

CITATION LIST

Patent Literature

Patent Literature 1: Japanese Patent Application Laid-open No. 2016-164947

SUMMARY

Technical Problem

A plurality of thermoelectric generation modules is connected, whereby an output of a thermoelectric generation device is increased. When there are a large number of interfaces on a cooling surface side of the thermoelectric generation modules, there is a possibility that it becomes difficult to increase a temperature difference between cooling surfaces and heating surfaces due to thermal resistance. There is a possibility that power generation efficiency of the thermoelectric generation modules is decreased when the temperature difference between the cooling surfaces and the heating surfaces is not increased.

An object of the present disclosure is to control a decrease in the power generation efficiency.

Solution to Problem

According to an aspect of the present invention, a thermoelectric generation device comprises: a first substrate having a first surface; a second substrate having a second surface facing the first surface; a plurality of thermoelectric generation modules each of which has a plurality of thermoelectric elements and electrodes connecting the thermoelectric elements and which is arranged between the first surface and the second surface; and wiring that is arranged on the first surface and that connects the plurality of thermoelectric generation modules.

Advantageous Effects of Invention

According to the present disclosure, a decrease in power generation efficiency is controlled.

DESCRIPTION OF EMBODIMENTS

In the following, embodiments according to the present disclosure will be described with reference to the drawings. However, the present disclosure is not limited to the embodiments. Components of the plurality of embodiments described in the following can be arbitrarily combined. Also, there is a case where a part of the components is not used.

In the embodiments, a positional relationship of units will be described with terms of "left", "right", "front", "back", "up", and "down". These terms indicate relative positions or directions with respect to a center of a thermoelectric generation device 1. A right-left direction, a front-back direction, and an up-down direction are orthogonal to each other.

[Thermoelectric Generation Device]

Figure 1:
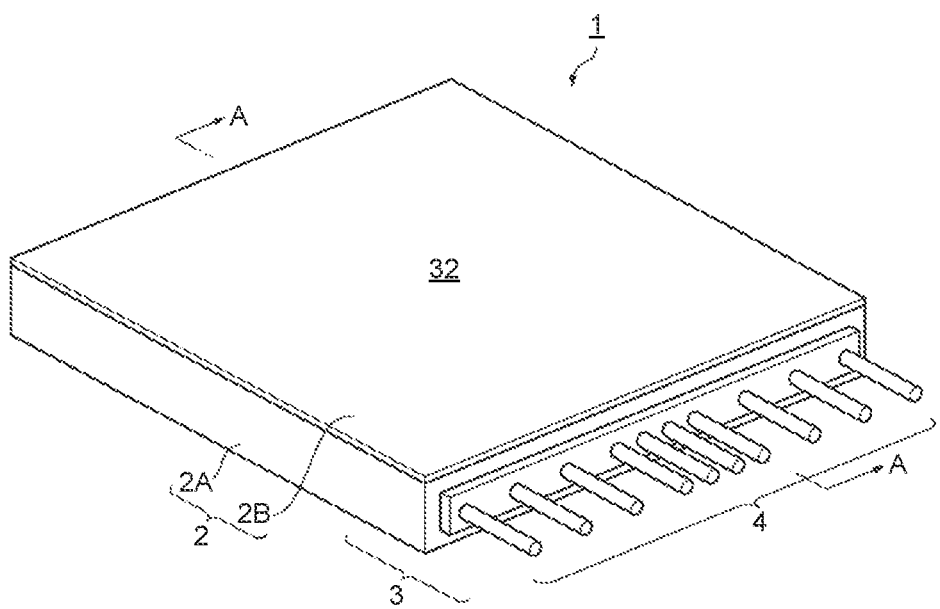
FIG. 1 is a perspective view illustrating a thermoelectric generation device according to an embodiment.
Figure 1:
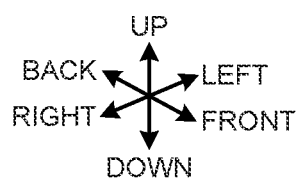
Figure 2:
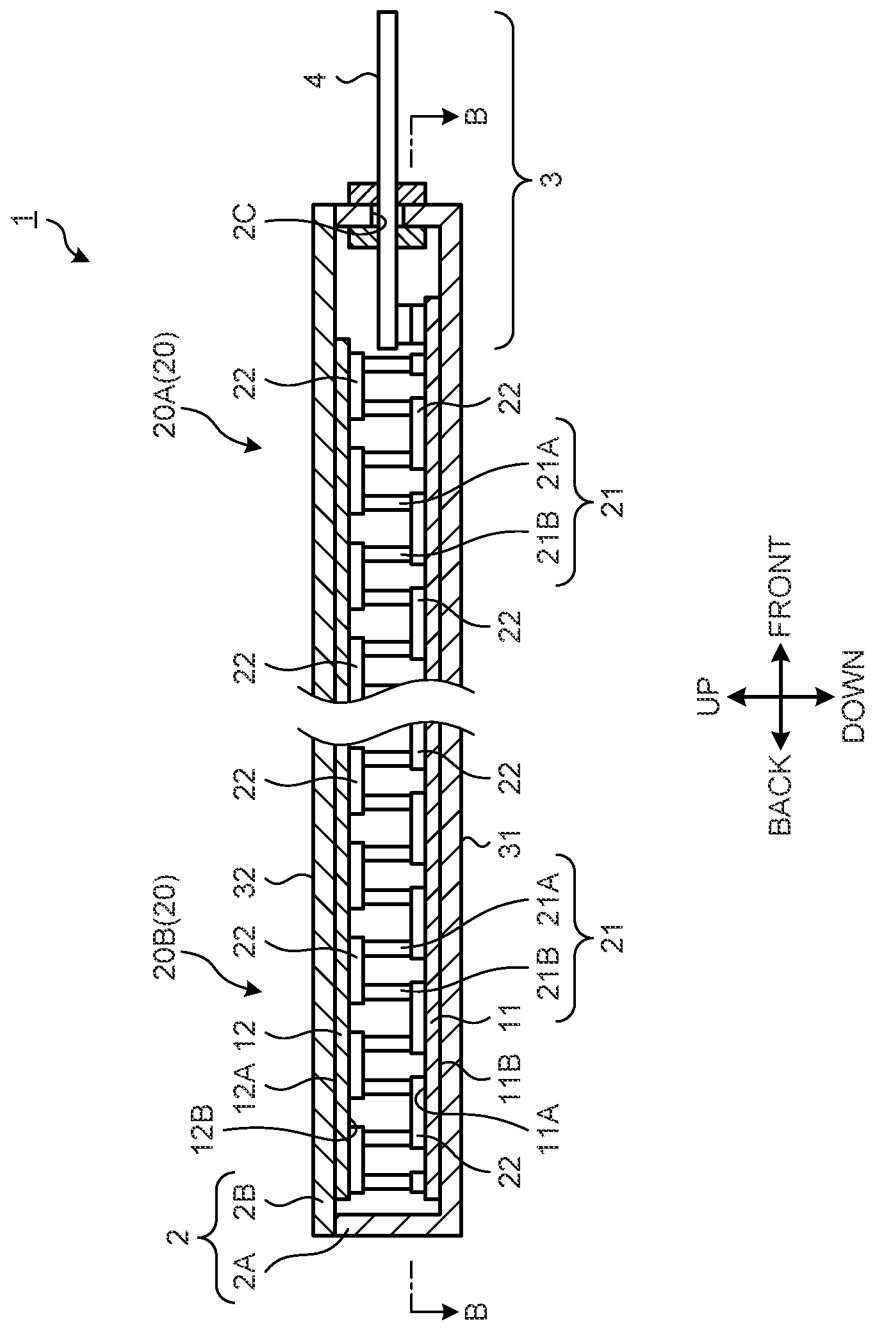
FIG. 2 is a cross-sectional view illustrating the thermoelectric generation device according to the embodiment, and is a view taken along a line A-A in FIG. 1.

FIG. 1 is a perspective view illustrating a thermoelectric generation device 1 according to an embodiment. FIG. 2 is a cross-sectional view illustrating the thermoelectric generation device 1 according to the embodiment, and is a view taken along a line A-A in FIG. 1.

As illustrated in FIG. 1 and FIG. 2, the thermoelectric generation device 1 includes a case 2, a first substrate 11 arranged in an internal space of the case 2, a second substrate 12 arranged in the internal space of the case 2, and a plurality of thermoelectric generation modules 20 arranged between the first substrate 11 and the second substrate 12.

The case 2 is made of metal. The case 2 includes a case main body 2A, and a case lid 2B connected to the case main body 2A. The case main body 2A includes a lower plate portion and a side plate portion. The case lid 2B is arranged in such a manner as to cover an opening in an upper portion of the case main body 2A. Note that each of the case main body 2A and the case lid 2B may be plated.

The internal space of the case 2 is sealed. The internal space of the case 2 is filled with inert gas. Examples of the inert gas include argon gas, nitrogen gas, and helium gas. Note that the internal space of the case 2 may be a vacuum.

A cooling surface 31 and a heating surface 32 are set on the case 2. A lower surface of the lower plate portion of the case main body 2A is the cooling surface 31, and an upper surface of the case lid 2B is the heating surface 32.

A connector 3 is attached to a side plate portion on a front side of the case main body 2A. The connector 3 is a hermetic connector capable of maintaining the sealed state of the case 2. The connector 3 has a plurality of lead pins 4. The lead pins 4 are arranged in through holes 2C formed in the side plate portion on the front side of the case main body 2A.

The plurality of lead pins 4 is provided. The lead pins 4 are arranged at intervals in the right-left direction in the side plate portion on the front side of the case main body 2A.

Each of the first substrate 11 and the second substrate 12 is formed of an electrical insulating material. In the embodiment, each of the first substrate 11 and the second substrate 12 is a ceramic substrate. Each of the first substrate 11 and the second substrate 12 is formed of an oxide ceramic or nitride ceramic. Examples of the oxide ceramic include aluminum oxide (Al2O3) and zirconium oxide (ZrO2). Examples of the nitride ceramic include silicon nitride (Si3N4) and aluminum nitride (AlN).

Note that at least one of the first substrate 11 and the second substrate 12 may be a substrate in which insulation treatment is performed on a surface of a metal plate.

The first substrate 11 and the second substrate 12 face each other with a gap therebetween. In the embodiment, the second substrate 12 is arranged above the first substrate 11. The first substrate 11 has an upper surface 11A (first surface) and a lower surface 11B. The second substrate 12 has a lower surface 12B (second surface) facing the upper surface 11A, and an upper surface 12A.

The plurality of thermoelectric generation modules 20 is arranged between the upper surface 11A of the first substrate 11 and the lower surface 12B of the second substrate 12. In the embodiment, four thermoelectric generation modules 20 are provided. The thermoelectric generation modules 20 include a first thermoelectric generation module 20A, a second thermoelectric generation module 20B, a third thermoelectric generation module 20C, and a fourth thermoelectric generation module 20D.

Each of the plurality of thermoelectric generation modules 20 includes a plurality of thermoelectric elements 21, and electrodes 22 connecting the plurality of thermoelectric elements 21.

The thermoelectric elements 21 are formed of a thermoelectric material. Examples of the thermoelectric material forming the thermoelectric elements 21 include a manganese silicide-based compound (Mn—Si), a magnesium silicide-based compound (Mg—Si—Sn), a skutterudite-based compound (Co—Sb), a half-Heusler compound (Zr—Ni—Sn), and a bismuth tellurium-based compound (Bi—Te). The thermoelectric elements 21 may be formed of one compound selected from the manganese silicide-based compound, the magnesium silicide-based compound, the skutterudite-based compound, the half-Heusler compound, and the bismuth tellurium-based compound, or may be formed of a combination of at least two compounds.

The thermoelectric elements 21 includes a p-type thermoelectric element 21A and an n-type thermoelectric element 21B. A plurality of the p-type thermoelectric elements 21A and a plurality of the n-type thermoelectric elements 21B are arranged in a predetermined plane. The p-type thermoelectric elements 21A and the n-type thermoelectric elements 21B are alternately arranged in the front-back direction. The p-type thermoelectric elements 21A and the n-type thermoelectric elements 21B are alternately arranged in the right-left direction.

The electrodes 22 are formed of metal. Examples of the metal forming the electrodes 22 include copper (Cu), an alloy including copper, nickel (Ni), an alloy including nickel, aluminum (Al), and an alloy including aluminum. Furthermore, a structure of the electrodes 22 may be a two-layer or three-layer structure in which two or three of Cu, Al, and Ni are combined. Surfaces of these electrodes 22 may be covered with a nickel film.

The electrodes 22 are provided on each of the upper surface 11A of the first substrate 11 and the lower surface 12B of the second substrate 12. The plurality of electrodes 22 is provided on a predetermined plane parallel to the upper surface 11A of the first substrate 11. The plurality of electrodes 22 is provided on a predetermined plane parallel to the lower surface 12B of the second substrate 12. Each of the electrodes 22 is connected to each of a pair of adjacent p-type thermoelectric element 21A and n-type thermoelectric element 21B.

In one thermoelectric generation module 20, the electrodes 22 connect the plurality of thermoelectric elements 21 in series. That is, the thermoelectric generation module 20 has a series circuit in which the plurality of thermoelectric elements 21 is connected in series by the electrodes 22. The p-type thermoelectric elements 21A and the n-type thermoelectric elements 21B are electrically connected via the electrodes 22 and form pn element pairs. The plurality of pn element pairs is connected in series via the electrodes 22, whereby the series circuit including the plurality of thermoelectric elements 21 is configured in each of the plurality of thermoelectric generation modules 20.

When current is supplied to the thermoelectric elements 21, the thermoelectric generation module 20 absorbs or generates heat by the Peltier effect. When a temperature difference is given between the first substrate 11 and the second substrate 12, the thermoelectric generation module 20 generates power by the Seebeck effect.

The first substrate 11 is in contact with the lower plate portion of the case main body 2A having the cooling surface 31. The second substrate 12 is in contact with the case lid 2B having the heating surface 32. Lower surfaces of the electrodes 22 arranged on the first substrate 11 are a cooling surface of the thermoelectric generation module 20. Upper surfaces of the electrodes 22 arranged on the second substrate 12 are a heating surface of the thermoelectric generation module 20. Note that the lower surface 11B of the first substrate 11 may be regarded as the cooling surface. The upper surface 12A of the second substrate 12 may be regarded as the heating surface.

[Wiring]

Figure 3:
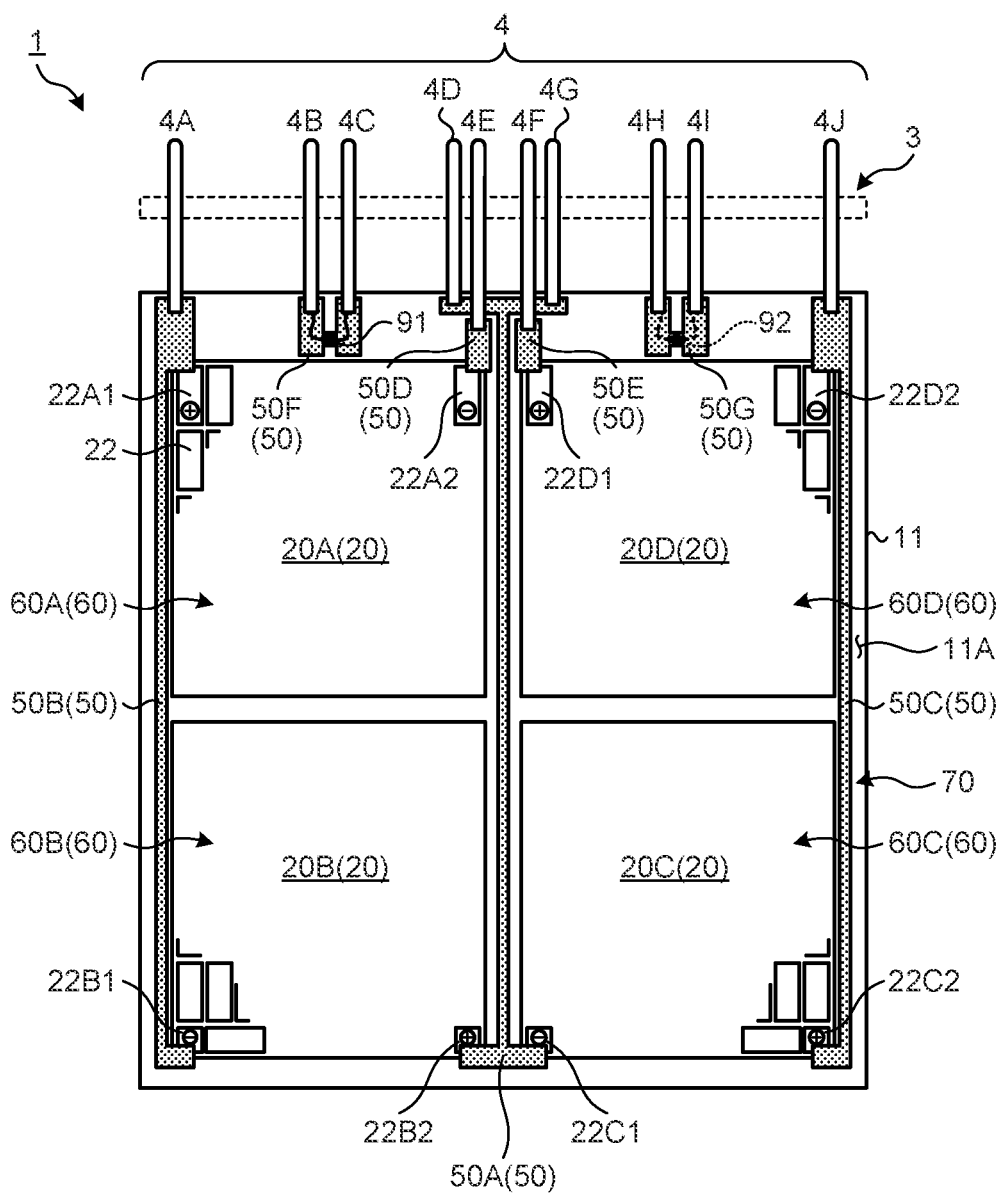
FIG. 3 is a cross-sectional view illustrating the thermoelectric generation device according to the embodiment, and is a view taken along a line B-B in FIG. 2.

FIG. 3 is a cross-sectional view illustrating the thermoelectric generation device 1 according to the embodiment, and is a view taken along a line B-B in FIG. 2. FIG. 3 is a view illustrating the upper surface 11A of the first substrate 11.

As illustrated in FIG. 3, the four thermoelectric generation modules 20 are provided. Two thermoelectric generation modules 20 are provided in the front-back direction, and two thermoelectric generation modules 20 are provided in the right-left direction. The thermoelectric generation modules 20 include the first thermoelectric generation module 20A, the second thermoelectric generation module 20B, the third thermoelectric generation module 20C, and the fourth thermoelectric generation module 20D.

In addition, the thermoelectric generation device 1 includes wiring 50 arranged on the upper surface 11A of the first substrate 11 and connected to the plurality of thermoelectric generation modules 20.

The upper surface 11A of the first substrate 11 includes a module region 60 in which the thermoelectric generation modules 20 are arranged, and a wiring region 70 which is arranged in at least a part of a periphery of the module region 60 and to which the wiring 50 is connected. The electrodes 22 of the thermoelectric generation modules 20 are connected to the module region 60. The wiring 50 is connected to the wiring region 70.

The module region 60 includes a first module region 60A in which the first thermoelectric generation module 20A is arranged, a second module region 60B in which the second thermoelectric generation module 20B is arranged, a third module region 60C in which the third thermoelectric generation module 20C is arranged, and a fourth module region 60D in which the fourth thermoelectric generation module 20D is arranged.

The first thermoelectric generation module 20A and the second thermoelectric generation module 20B are arranged in the front-back direction. The first thermoelectric generation module 20A is arranged in front of the second thermoelectric generation module 20B. Compared to the second thermoelectric generation module 20B, the first thermoelectric generation module 20A is arranged at a position close to the connector 3.

The third thermoelectric generation module 20C and the fourth thermoelectric generation module 20D are arranged in the front-back direction. The fourth thermoelectric generation module 20D is arranged in front of the third thermoelectric generation module 20C. Compared to the third thermoelectric generation module 20C, the fourth thermoelectric generation module 20D is arranged at a position close to the connector 3.

The first thermoelectric generation module 20A and the fourth thermoelectric generation module 20D are arranged in the right-left direction. The first thermoelectric generation module 20A is arranged on a left side of the fourth thermoelectric generation module 20D.

The second thermoelectric generation module 20B and the third thermoelectric generation module 20C are arranged in the right-left direction. The second thermoelectric generation module 20B is arranged on a left side of the third thermoelectric generation module 20C.

The wiring 50 is arranged on the upper surface 11A and connects the plurality of thermoelectric generation modules 20. The wiring 50 is a thin film or a thick film formed of metal, and is a film having a film thickness of, for example, about 2 μm or more and 1 mm or less. Examples of the metal forming the wiring 50 include copper (Cu), an alloy including copper, nickel (Ni), an alloy including nickel, aluminum (Al), and an alloy including aluminum. Furthermore, a part or a whole surface of the wiring 50 may be coated with a material resistant to oxidation (material that is hardly oxidized) such as Au or Ni.

The wiring region 70 in which the wiring 50 is arranged is set in a peripheral edge region of the upper surface 11A, and between adjacent module regions 60.

In the embodiment, the wiring 50 includes central wiring 50A, left-side wiring 50B, right-side wiring 50C, first front wiring 50D, second front wiring 50E, third front wiring 50F, and fourth front wiring 50G.

The central wiring 50A extends in the front-back direction. In the right-left direction, at least a part of the central wiring 50A is arranged between the first thermoelectric generation module 20A and the second thermoelectric generation module 20B, and the third thermoelectric generation module 20C and the fourth thermoelectric generation module 20D. A front-end portion of the central wiring 50A is arranged in front (on a connector 3 side) of the first thermoelectric generation module 20A and the fourth thermoelectric generation module 20D. A back-end portion of the central wiring 50A is arranged behind the second thermoelectric generation module 20B and the third thermoelectric generation module 20C.

The left-side wiring 50B extends in the front-back direction. At least a part of the left-side wiring 50B is arranged on a left side of the first thermoelectric generation module 20A and the second thermoelectric generation module 20B. A front-end portion of the left-side wiring 50B is arranged in front (on the connector 3 side) of the first thermoelectric generation module 20A. A back-end portion of the left-side wiring 50B is arranged behind the second thermoelectric generation module 20B.

The right-side wiring 50C extends in the front-back direction. At least a part of the right-side wiring 50C is arranged on a right side of the third thermoelectric generation module 20C and the fourth thermoelectric generation module 20D. A front-end portion of the right-side wiring 50C is arranged in front (on the connector 3 side) of the fourth thermoelectric generation module 20D. A back-end portion of the right-side wiring 50C is arranged behind the third thermoelectric generation module 20C.

At least a part of the first front wiring 50D is arranged in front of the first thermoelectric generation module 20A. At least a part of the second front wiring 50E is arranged in front of the fourth thermoelectric generation module 20D.

The third front wiring 50F is arranged in front of the first thermoelectric generation module 20A. The third front wiring 50F is arranged in front of the fourth thermoelectric generation module 20D.

The connector 3 has the plurality of lead pins 4. The lead pins 4 are arranged at intervals in the right-left direction. The lead pins 4 are connected to both end portions of an output circuit in units of the thermoelectric generation modules 20. In the embodiment, ten lead pins 4 are provided. In the following description, the ten lead pins 4 will be appropriately referred to as lead pins 4A, 4B, 4C, 4D, 4E, 4F, 4G, 4H, 4I, and 4J, respectively.

The first thermoelectric generation module 20A includes an electrode 22A1 arranged at one end portion of the series circuit of the first thermoelectric generation module 20A, and an electrode 22A2 arranged at the other end portion of the series circuit of the first thermoelectric generation module 20A. The electrode 22A1 is arranged at a frontmost and leftmost position among the plurality of electrodes 22 of the first thermoelectric generation module 20A. The electrode 22A2 is arranged at a frontmost and rightmost position among the plurality of electrodes 22 of the first thermoelectric generation module 20A. The electrode 22A1 is a positive pole. The electrode 22A2 is a negative pole.

The fourth thermoelectric generation module 20D includes an electrode 22D1 arranged at one end portion of the series circuit of the fourth thermoelectric generation module 20D, and an electrode 22D2 arranged at the other end portion of the series circuit of the fourth thermoelectric generation module 20D. The electrode 22D1 is arranged at a frontmost and leftmost position among the plurality of electrodes 22 of the fourth thermoelectric generation module 20D. The electrode 22D2 is arranged at a frontmost and rightmost position among the plurality of electrodes 22 of the fourth thermoelectric generation module 20D. The electrode 22D1 is a positive pole. The electrode 22D2 is a negative pole.

The second thermoelectric generation module 20B includes an electrode 22B1 arranged at one end portion of the series circuit of the second thermoelectric generation module 20B, and an electrode 22B2 arranged at the other end portion of the series circuit of the second thermoelectric generation module 20B. The electrode 22B1 is arranged at a rearmost and leftmost position among the plurality of electrodes 22 of the second thermoelectric generation module 20B. The electrode 22B2 is arranged at a rearmost and rightmost position among the plurality of electrodes 22 of the second thermoelectric generation module 20B. The electrode 22B1 is a negative pole. The electrode 22B2 is a positive pole.

The third thermoelectric generation module 20C includes an electrode 22C1 arranged at one end portion of the series circuit of the third thermoelectric generation module 20C, and an electrode 22C2 arranged at the other end portion of the series circuit of the third thermoelectric generation module 20C. The electrode 22C1 is arranged at a rearmost and leftmost position among the plurality of electrodes 22 of the third thermoelectric generation module 20C. The electrode 22C2 is arranged at a rearmost and rightmost position among the plurality of electrodes 22 of the third thermoelectric generation module 20C. The electrode 22C1 is a negative pole. The electrode 22C2 is a positive pole.

The central wiring 50A connects the second thermoelectric generation module 20B and the third thermoelectric generation module 20C. The central wiring 50A connects the electrode 22B2 arranged at the end portion of the series circuit of the second thermoelectric generation module 20B and the electrode 22C1 arranged at the end portion of the series circuit of third thermoelectric generation module 20C. The electrode 22B2 of the second thermoelectric generation module 20B is connected to a back-end portion of the central wiring 50A. The electrode 22C1 of the third thermoelectric generation module 20C is connected to the back-end portion of the central wiring 50A.

The left-side wiring 50B connects the first thermoelectric generation module 20A and the second thermoelectric generation module 20B. The left-side wiring 50B connects the electrode 22A1 arranged at the end portion of the series circuit of the first thermoelectric generation module 20A and the electrode 22B1 arranged at the end portion of the series circuit of the second thermoelectric generation module 20B. The electrode 22A1 of the first thermoelectric generation module 20A is connected to a front-end portion of the left-side wiring 50B. The electrode 22B1 of the second thermoelectric generation module 20B is connected to a back-end portion of the left-side wiring 50B.

The right-side wiring 50C connects the third thermoelectric generation module 20C and the fourth thermoelectric generation module 20D. The right-side wiring 50C connects the electrode 22D2 arranged at the end portion of the series circuit of the fourth thermoelectric generation module 20D and the electrode 22C2 arranged at the end portion of the series circuit of the third thermoelectric generation module 20C. The electrode 22D2 of the fourth thermoelectric generation module 20D is connected to a front-end portion of the right-side wiring 50C. The electrode 22C2 of the third thermoelectric generation module 20C is connected to a back-end portion of the right-side wiring 50C.

The first front wiring 50D is connected to the electrode 22A2 of the first thermoelectric generation module 20A.

The second front wiring 50E is connected to the electrode 22D1 of the fourth thermoelectric generation module 20D.

The lead pin 4A is connected to the front-end portion of the left-side wiring 50B. The lead pin 4D is connected to the front-end portion of the central wiring 50A. The lead pin 4E is connected to the first front wiring 50D. The lead pin 4F is connected to the second front wiring 50E. The lead pin 4G is connected to the front-end portion of the central wiring 50A. The lead pin 4J is connected to the front-end portion of the right-side wiring 50C.

Each of the electrode 22A1 and the electrode 22B1 is connected to the lead pin 4A via the left-side wiring 50B.

Each of the electrode 22D2 and the electrode 22C2 is connected to the lead pin 4J via the right-side wiring 50C.

Each of the electrode 22B2 and the electrode 22C1 is connected to the lead pin 4D and the lead pin 4G via the central wiring 50A.

The electrode 22A2 is connected to the lead pin 4E via the first front wiring 50D.

The electrode 22D1 is connected to the lead pin 4F via the second front wiring 50E.

The lead pin 4B and the lead pin 4C are connected to the third front wiring 50F. The third front wiring 50F is connected to a first thermocouple 91 arranged on the first substrate 11. The first thermocouple 91 detects a temperature of the upper surface 11A of the first substrate 11 (cooling surface 31) on which the thermoelectric generation modules 20 are arranged.

The lead pin 4H and the lead pin 4I are connected to the fourth front wiring 50G. The fourth front wiring 50G is connected to a second thermocouple 92 arranged on the second substrate 12. The second thermocouple 92 detects a temperature of the lower surface 12B of the second substrate 12 (heating surface 32) on which the thermoelectric generation modules 20 are arranged.

The lead pin 4D and the lead pin 4G are connected to each other via the central wiring 50A.

[Diagnosis of Thermoelectric Generation Module]

In the thermoelectric generation device 1, it is possible to diagnose states of the thermoelectric generation modules 20 by supplying of current to the lead pins 4.

(1) Diagnosis of the First Thermoelectric Generation Module 20A

In a case where a state of the first thermoelectric generation module 20A is diagnosed, current is supplied to the lead pin 4A. In a case where the state of the first thermoelectric generation module 20A is normal, the current supplied to the lead pin 4A flows into the electrode 22A1 of the first thermoelectric generation module 20A through the left-side wiring 50B, then flows through the series circuit of the first thermoelectric generation module 20A, and is output from the lead pin 4E through the electrode 22A2 of the first thermoelectric generation module 20A and the first front wiring 50D.

(2) Diagnosis of the Second Thermoelectric Generation Module 20B

In a case where a state of the second thermoelectric generation module 20B is diagnosed, current is supplied to the lead pin 4D. In a case where the state of the second thermoelectric generation module 20B is normal, the current supplied to the lead pin 4D flows into the electrode 22B2 of the second thermoelectric generation module 20B through the central wiring 50A, then flows through the series circuit of the second thermoelectric generation module 20B, and is output from the lead pin 4A through the electrode 22B1 of the second thermoelectric generation module 20B and the left-side wiring 50B.

(3) Diagnosis of the Third Thermoelectric Generation Module 20C

In a case where a state of the third thermoelectric generation module 20C is diagnosed, current is supplied to the lead pin 4J. In a case where the state of the third thermoelectric generation module 20C is normal, the current supplied to the lead pin 4J flows into the electrode 22C2 of the third thermoelectric generation module 20C through the right-side wiring 50C, then flows through the series circuit of the third thermoelectric generation module 20C, and is output from the lead pin 4G through the electrode 22C1 of the third thermoelectric generation module 20C and the central wiring 50A.

(4) Diagnosis of the Fourth Thermoelectric Generation Module 20D

In a case where a state of the fourth thermoelectric generation module 20D is diagnosed, current is supplied to the lead pin 4F. In a case where the state of the fourth thermoelectric generation module 20D is normal, the current supplied to the lead pin 4F flows into the electrode 22D1 of the fourth thermoelectric generation module 20D through the second front wiring 50E, then flows through the series circuit of the fourth thermoelectric generation module 20D, and is output from the lead pin 4J through the electrode 22D2 of the fourth thermoelectric generation module 20D and the right-side wiring 50C.

(5) Diagnosis of the First and Second thermoelectric generation modules 20A and 20B In a case where a state of a combination of the first thermoelectric generation module 20A and the second thermoelectric generation module 20B is diagnosed, current is supplied to the lead pin 4D. In a case where the state of the combination of the first thermoelectric generation module 20A and the second thermoelectric generation module 20B is normal, the current supplied to the lead pin 4D flows into the electrode 22B2 of the second thermoelectric generation module 20B through the central wiring 50A, then flows through the series circuit of the second thermoelectric generation modules 20B, and is output from the electrode 22B1 of the second thermoelectric generation module 20B to the left-side wiring 50B. The current output to the left-side wiring 50B flows into the electrode 22A1 of the first thermoelectric generation module 20A, then flows through the series circuit of the first thermoelectric generation modules 20A, and is output to the lead pin 4E from the electrode 22A2 of the first thermoelectric generation module 20A through the first front wiring 50D.

(6) Diagnosis of the First, Second, and Third Thermoelectric Generation Modules 20A, 20B, and 20C In a case where a state of a combination of the first thermoelectric generation module 20A, the second thermoelectric generation module 20B, and the third thermoelectric generation module 20C is diagnosed, current is supplied to the lead pin 4J. In a case where the state of the combination of the first thermoelectric generation module 20A, the second thermoelectric generation module 20B, and the third thermoelectric generation module 20C is normal, the current supplied to the lead pin 4J flows into the electrode 22C2 of the third thermoelectric generation module 20C through the right-side wiring 50C, then flows through the series circuit of the third thermoelectric generation modules 20C, and is output from the electrode 22C1 of the third thermoelectric generation module 20C to the central wiring 50A. The current output to the central wiring 50A flows into the electrode 22B2 of the second thermoelectric generation module 20B, then flows through the series circuit of the second thermoelectric generation module 20B, and is output to the left-side wiring 50B from the electrode 22B1 of the second thermoelectric generation module 20B. The current output to the left-side wiring 50B flows into the electrode 22A1 of the first thermoelectric generation module 20A, then flows through the series circuit of the first thermoelectric generation modules 20A, and is output to the lead pin 4E from the electrode 22A2 of the first thermoelectric generation module 20A through the first front wiring 50D.

(7) Diagnosis of the Second, Third, and Fourth Thermoelectric Generation Modules 20B, 20C, and 20D In a case where a state of a combination of the second thermoelectric generation module 20B, the third thermoelectric generation module 20C, and the fourth thermoelectric generation module 20D is diagnosed, current is supplied to the lead pin 4F. In a case where the state of the combination of the second thermoelectric generation module 20B, the third thermoelectric generation module 20C, and the fourth thermoelectric generation module 20D is normal, the current supplied to the lead pin 4F flows into the electrode 22D1 of the fourth thermoelectric generation module 20D through the second front wiring 50E, then flows through the series circuit of the fourth thermoelectric generation modules 20D, and is output from the electrode 22D2 of the fourth thermoelectric generation module 20D to the right-side wiring 50C. The current output to the right-side wiring 50C flows into the electrode 22C2 of the third thermoelectric generation module 20C, then flows through the series circuit of the third thermoelectric generation module 20C, and is output to the central wiring 50A from the electrode 22C1 of the third thermoelectric generation module 20C. The current output to the central wiring 50A flows into the electrode 22B2 of the second thermoelectric generation module 20B, then flows through the series circuit of the second thermoelectric generation module 20B, and is output to the lead pin 4A from the electrode 22B1 of the second thermoelectric generation module 20B through the left-side wiring 50B.

(8) Diagnosis of the First, Second, Third, and Fourth Thermoelectric Generation Modules 20A, 20B, 20C, and 20D In a case where a state of a combination of the first thermoelectric generation module 20A, the second thermoelectric generation module 20B, the third thermoelectric generation module 20C, and the fourth thermoelectric generation module 20D is diagnosed, current is supplied to the lead pin 4F. In a case where the state of the combination of the first thermoelectric generation module 20A, the second thermoelectric generation module 20B, the third thermoelectric generation module 20C, and the fourth thermoelectric generation module 20D is normal, the current supplied to the lead pin 4F flows into the electrode 22D1 of the fourth thermoelectric generation module 20D through the second front wiring 50E, then flows through the series circuit of the fourth thermoelectric generation modules 20D, and is output from the electrode 22D2 of the fourth thermoelectric generation module 20D to the right-side wiring 50C. The current output to the right-side wiring 50C flows into the electrode 22C2 of the third thermoelectric generation module 20C, then flows through the series circuit of the third thermoelectric generation module 20C, and is output to the central wiring 50A from the electrode 22C1 of the third thermoelectric generation module 20C. The current output to the central wiring 50A flows into the electrode 22B2 of the second thermoelectric generation module 20B, then flows through the series circuit of the second thermoelectric generation module 20B, and is output to the left-side wiring 50B from the electrode 22B1 of the second thermoelectric generation module 20B. The current output to the left-side wiring 50B flows into the electrode 22A1 of the first thermoelectric generation module 20A, then flows through the series circuit of the first thermoelectric generation modules 20A, and is output to the lead pin 4E from the electrode 22A2 of the first thermoelectric generation module 20A through the first front wiring 50D.

(9) Diagnosis of the Second and Third Thermoelectric Generation Modules 20B and 20C In a case where a state of a combination of the second thermoelectric generation module 20B and the third thermoelectric generation module 20C is diagnosed, current is supplied to the lead pin 4J. In a case where the state of the combination of the second thermoelectric generation module 20B and the third thermoelectric generation module 20C is normal, the current supplied to the lead pin 4J flows into the electrode 22C2 of the third thermoelectric generation module 20C through the right-side wiring 50C, then flows through the series circuit of the third thermoelectric generation module 20C, and is output from the electrode 22C1 of the third thermoelectric generation module 20C to the central wiring 50A. The current output to the central wiring 50A flows into the electrode 22B2 of the second thermoelectric generation module 20B, then flows through the series circuit of the second thermoelectric generation module 20B, and is output to the lead pin 4A from the electrode 22B1 of the second thermoelectric generation module 20B through the left-side wiring 50B.

(10) Diagnosis of the Third and Fourth Thermoelectric Generation Modules 20C and 20D In a case where a state of a combination of the third thermoelectric generation module 20C and the fourth thermoelectric generation module 20D is diagnosed, current is supplied to the lead pin 4F. In a case where the state of the combination of the third thermoelectric generation module 20C and the fourth thermoelectric generation module 20D is normal, the current supplied to the lead pin 4F flows into the electrode 22D1 of the fourth thermoelectric generation module 20D through the second front wiring 50E, then flows through the series circuit of the fourth thermoelectric generation module 20D, and is output from the electrode 22D2 of the fourth thermoelectric generation module 20D to the right-side wiring 50C. The current output to the right-side wiring 50C flows into the electrode 22C2 of the third thermoelectric generation module 20C, then flows through the series circuit of the third thermoelectric generation module 20C, and is output to the lead pin 4G from the electrode 22C1 of the third thermoelectric generation module 20C through the central wiring 50A.

Effect

As described above, according to the embodiment, the wiring 50 that connects the plurality of thermoelectric generation modules 20 is arranged on the upper surface 11A of the first substrate 11. The first substrate 11 is a single-layer substrate. A thickness of the first substrate 11 is sufficiently thin. Since the first substrate 11 is the single-layer substrate, there is no interface. This controls an increase in thermal resistance of the first substrate 11. Thus, a decrease in a temperature difference between cooling surfaces and heating surfaces of the thermoelectric generation modules 20 is controlled. Thus, a decrease in power generation efficiency of the thermoelectric generation modules 20 is controlled.

In addition, since the wiring 50 is arranged only on the upper surface 11A of the first substrate 11, an increase in a total length of the wiring 50 is controlled. Thus, an increase in size of the thermoelectric generation device 1 is controlled.

Each of the thermoelectric generation modules 20 has the series circuit in which the plurality of thermoelectric elements 21 is connected in series by the electrodes 22. The wiring 50 connects an electrode 22 arranged at an end portion of a series circuit of a first thermoelectric generation module 20 and an electrode 22 arranged at an end portion of a series circuit of a second thermoelectric generation module 20. That is, the wiring 50 connects the electrodes 22 arranged at the end portions of the series circuits of the thermoelectric generation modules 20. As a result, the states of the thermoelectric generation modules 20 are properly diagnosed.

The upper surface 11A of the first substrate 11 includes the module region 60 to which the electrodes 22 are connected, and the wiring region 70 which is arranged in at least a part of the periphery of the module region 60 and to which the wiring 50 is connected. That is, both of the wiring 50 and the electrodes 22 of the thermoelectric generation modules 20 are arranged on the upper surface 11A of the first substrate 11. Thus, complication of the thermoelectric generation device 1 is controlled.

The first substrate 11 has the cooling surface, and the second substrate 12 has the heating surface. That is, the first substrate 11 is not heated in power generation using the Seebeck effect. As a result, deterioration of the wiring 50 due to heat is controlled. Also, when the wiring 50 is heated, there is a possibility that a phenomenon in which the electric resistance of the wiring 50 increases is generated. In the embodiment, the increase in the electric resistance of the wiring 50 is controlled since heating of the wiring 50 is controlled.

In the embodiment, the plurality of lead pins 4 protrudes forward from the side plate portion on the front side of the case main body 2A. Furthermore, the plurality of lead pins 4 is arranged at intervals in the right-left direction. The lead pins 4 are connected to both end portions of the output circuits in units of the thermoelectric generation modules 20. By selecting the lead pin 4 to which the current is input and the lead pin 4 from which the current is output, it is possible to individually diagnose the states of the thermoelectric generation modules 20 or collectively diagnose the state of the combination of the plurality of thermoelectric generation modules 20.

Modification Example

Figure 4:
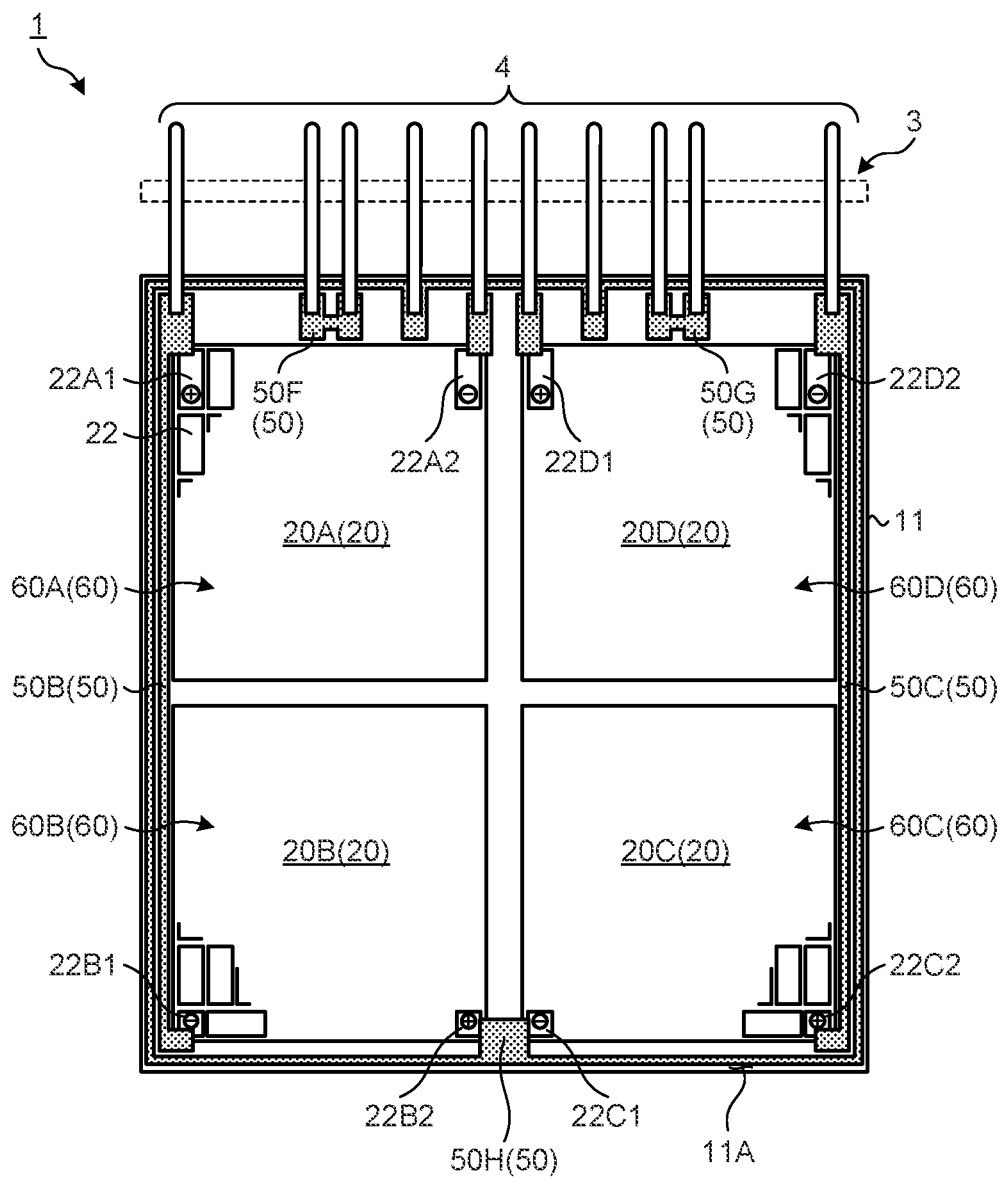
FIG. 4 is a cross-sectional view illustrating a thermoelectric generation device according to a modification example of the embodiment.
Figure 4:
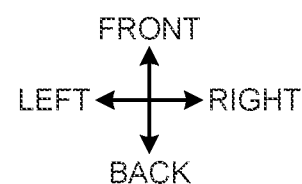

FIG. 4 is a cross-sectional view illustrating a thermoelectric generation device 1 according to a modification example of the embodiment. It is assumed that the wiring 50 includes the central wiring 50A in the above-described embodiment. As illustrated in FIG. 4, there may be no central wiring 50A. In the example illustrated in FIG. 4, wiring 50 includes left-side wiring 50B, right-side wiring 50C, and peripheral wiring 50H arranged on a peripheral edge portion of an upper surface 11A of a first substrate 11.

In the example illustrated in FIG. 4, the left-side wiring 50B is connected to an electrode 22A1 and an electrode 22B1. The right-side wiring 50C is connected to an electrode 22D2 and an electrode 22C2. A part of the peripheral wiring 50H is connected to an electrode 22B2 and an electrode 22C1.

Also in the example illustrated in FIG. 4, an increase in thermal resistance of the first substrate 11 is controlled. Thus, a decrease in a temperature difference between cooling surfaces and heating surfaces of thermoelectric generation modules 20 is controlled. In addition, an increase in a total length of the wiring 50 is controlled.

Figure 5:
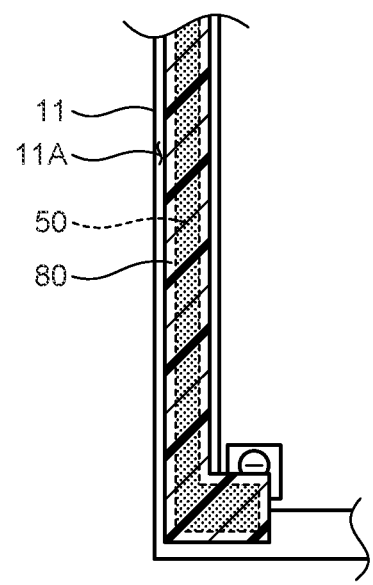
FIG. 5 is a schematic diagram illustrating a part of a first substrate according to the modification example of the embodiment.
Figure 5:
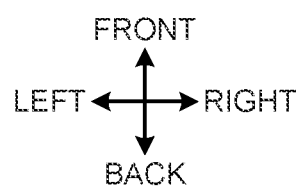

FIG. 5 is a schematic diagram illustrating a part of the first substrate 11 according to the modification example of the embodiment. As illustrated in FIG. 5, a heat insulating material 80 covering the wiring 50 may be provided. The heat insulating material 80 has an insulation property. Since the heat insulating material 80 having the insulation property is arranged in such a manner as to cover the wiring 50, deterioration of the wiring 50 due to heat is controlled.

The invention claimed is:

1. A thermoelectric generation device comprising:
a first substrate that is a single-layer substrate having (i) a first surface and (ii) a cooling surface disposed opposite to the first surface in a first direction, the first substrate extending in a second direction orthogonal to the first direction;
a second substrate spaced apart from the first substrate in the first direction, the second substrate having (i) a second surface facing the first surface and (ii) a heating surface opposite to the second surface in the first direction;
a plurality of thermoelectric generation modules, each of which has a plurality of thermoelectric elements and electrodes connecting the thermoelectric elements, each of the plurality of thermoelectric elements being arranged between the first surface and the second surface; and
a wiring that is arranged on the first surface and that connects the plurality of thermoelectric generation modules, the wiring extending in the second direction,
wherein the first surface includes a plurality of module regions in which the plurality of thermoelectric generation modules are disposed, respectively, the plurality of module regions being spaced apart from one another in (i) the second direction and (ii) a third direction that is orthogonal to the first direction and the second direction,
wherein the wiring includes a central wiring that extends in the second direction through a central wiring region of the first surface that separates the plurality of module regions of the first surface from one another in the third direction, and
wherein an end portion of the central wiring symmetrically extends in the third direction and is disposed outside the plurality of module regions.

2. The thermoelectric generation device according to claim 1, wherein each of the thermoelectric generation modules has a series circuit in which the plurality of thermoelectric elements are connected in series by the electrodes, and
wherein the wiring connects the electrodes arranged at end portions of the series circuits of the thermoelectric generation modules.

3. The thermoelectric generation device according to claim 1, wherein the first surface further includes a periphery wiring region arranged in at least a part of a periphery of the plurality of module regions, and
wherein the wiring further includes a periphery wiring that is disposed in the periphery wiring region.

4. The thermoelectric generation device according to claim 1, further comprising a heat insulating material covering the wiring.

5. The thermoelectric generation device according to claim 1, further comprising lead pins connected to both end portions of output circuits in units of the thermoelectric generation modules.

6. The thermoelectric generation device according to claim 1, wherein the wiring is arranged only on the first surface among the first surface and the second surface.

7. The thermoelectric generation device according to claim 1, further comprising a case that is disposed outside of the first substrate and the second substrate and that is in contact with the cooling surface and the heating surface.

8. The thermoelectric generation device according to claim 1, wherein the electrodes comprise a plurality of first electrodes that are disposed between the first surface and first sides of the plurality of thermoelectric elements, and
wherein the plurality of first electrodes are in direct contact with the first surface of the first substrate.

9. The thermoelectric generation device according to claim 8, wherein the electrodes further comprise a plurality of second electrodes that are disposed between the second surface and second sides of the plurality of thermoelectric elements, and
wherein the plurality of second electrodes are in direct contact with the second surface of the second substrate.

* * * * *